United States Patent
Ishizaka

Patent Number: 6,037,820
Date of Patent: Mar. 14, 2000

[54] CLOCK DISTRIBUTION CIRCUIT IN A SEMICONDUCTOR INTEGRATED CIRCUIT

[75] Inventor: Kinya Ishizaka, Kawasaki, Japan

[73] Assignee: Fujitsu Limited, Kawasaki, Japan

[21] Appl. No.: 09/084,776

[22] Filed: May 27, 1998

[30] Foreign Application Priority Data

Dec. 12, 1997 [JP] Japan .................................. 9-342786

[51] Int. Cl.[7] .............................................. H03K 19/096
[52] U.S. Cl. ............................................ 327/292; 327/295
[58] Field of Search .................................. 327/292, 293, 327/295, 297, 299, 565, 564; 326/101; 713/500, 503, 600

[56] References Cited

U.S. PATENT DOCUMENTS 5,521,541  5/1996  Okamura .................................. 327/297
5,691,662  11/1997  Soboleski et al. ........................ 327/565

FOREIGN PATENT DOCUMENTS

1-289155  11/1989  Japan .
5-159080  6/1993  Japan .
6-244282  9/1994  Japan .

*Primary Examiner*—Tuan T. Lam
*Attorney, Agent, or Firm*—Armstrong, Westerman, Hattori, McLeland & Naughton

[57] ABSTRACT

A clock distribution circuit reliably reduces clock skew, while preventing the waveform of a clock signal from rounding, which would otherwise occur due to an increase in resistance, and preventing instability of the clock signal, which would otherwise occur due to an increase in inductance, thereby realizing ideal clock distribution. In the clock distribution circuit, a clock wiring pattern for distributing the clock signal is formed on a chip, and a wiring pattern whose resistance is lower than the clock wiring pattern is formed on a substrate, on which the chip is mounted, in such a way as to be connected to the clock wiring pattern at a plurality of locations. The clock distribution circuit is applied to semiconductor integrated circuits such as LSIs built in multichip modules.

24 Claims, 6 Drawing Sheets

11(□) : FIRST-STAGE DRIVER
12(△) : SECOND-STAGE DRIVER
13(▲) : THIRD-STAGE DRIVER
14,15(—) : CLOCK WIRING PATTERNS
31(---) : MESH-SHAPED WIRING PATTERN
40(○) : BUMP

CLOCK DISTRIBUTION CIRCUIT IN A SEMICONDUCTOR INTEGRATED CIRCUIT

BACKGROUND OF THE INVENTION

1) Field of the Invention

The present invention relates to a clock distribution circuit which distributes a clock signal to a plurality of cells having clock terminals in a semiconductor integrated circuit in which the plurality of cells are formed on a chip, and more particularly to a clock distribution circuit suitable for use in a semiconductor integrated circuit, such as an LSI, to be incorporated into a multichip module (hereinafter often abbreviated as "MCM").

2) Description of the Related Art

Generally, in the case of a semiconductor integrated circuit, e.g., an LSI, the overall LSI is operated in synchronism with a clock signal or a plurality of clock signals which are out of phase with one another. In such a case, the clock signal received from the outside of the circuit is distributed to flip-flops and the like (cells having clock terminals), in respective parts of the LSI, whereby decoding operations, reading or writing of memory, or various arithmetic operations are performed. If there are differences in length among wiring patterns from the origin of distribution of the clock signal to destinations to which the distributed clock signal is supplied, discrepancies arise in timing at which the clock signals arrive at the destinations (i.e., clock skew arises). If clock skew occurs, there arises a risk that the flip-flop or the like takes in an erroneous signal or that unwanted whisker-like pulses are generated at an output of a logic gate, both resulting in erroneous operation of the circuit. Accordingly, the magnitude of clock skew determines the performance (e.g., an operating speed) of the LSI.

Figure 4:
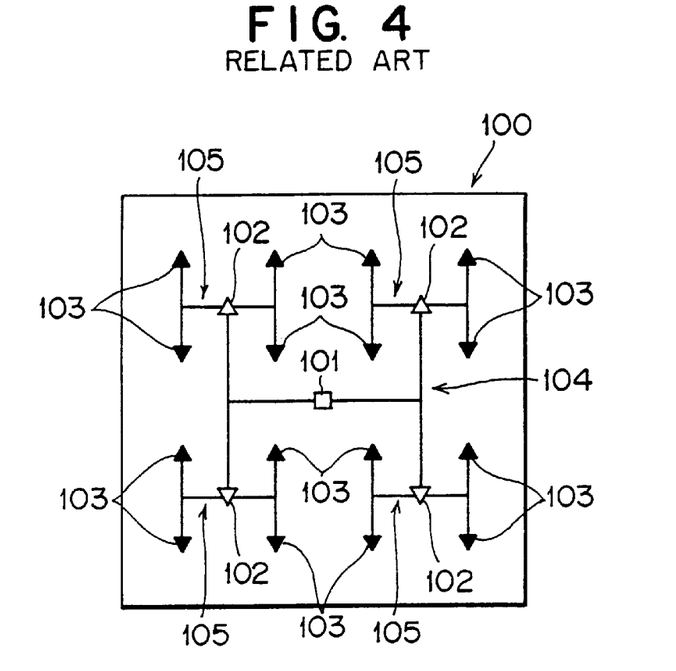
FIG. 4 is a circuit diagram showing a semiconductor integrated circuit (or chip) to which a conventional H-tree clock distribution method is applied.

To prevent such clock skew, an H tree clock distribution method such as that shown in FIG. 4 has conventionally been used for a semiconductor integrated circuit, e.g., an LSI. Under the H tree clock distribution method shown in FIG. 4, buffers 101 to 103 are provided in a plurality of stages (three stages are shown in FIG. 4) on a square chip 100, and these buffers 101 to 103 are connected in the form of a tree by means of H-shaoed clock wiring patterns 104 and 105.

More specifically, a first-stage driver 101 for receiving a clock signal from the outside of the chip is disposed at the center of the chip 100. An output from the first-stage driver 101 is input to four second-stage drivers 102 by way of the H-shaped clock wiring pattern 104 centered on the driver 101. The second-stage drivers 102 are provided at the four respective ends of the H-shaped clock wiring pattern 104. The wiring patterns from the first-stage driver 101 to the four second-stage drivers 102 are equal in length.

An output from each of the second-stage drivers 102 is further input to four third-stage drivers 103 by way of an H-shaped clock wiring pattern 105 centered on the corresponding driver 102. The third-stage drivers 103 are provided at the four respective ends of the corresponding H-shaped clock wiring pattern 105. The wiring patterns from the second-stage driver 102 to the corresponding four third-stage drivers 103 are equal in length.

With the drivers 101 to 103 being connected together by way of the clock wiring patterns 104 and 105, the clock signal is supplied to the sixteen third-stage drivers 103 provided at a substantially uniform density within the cell region of the chip 100, and the clock signal is supplied to the clock terminal of the flip-flop or the like from each of the third-stage driver 103. At this time, the wiring patterns from the first-stage driver 101 to the third-stage drivers 103 become substantially equal in length, and the clock skew can be made uniform among the drivers 103 in the final stage. The third-stage drivers 103 may be connected to other drivers by way of other H-shaped clock wiring patterns, thereby further distributing the clock signal.

Figure 5:
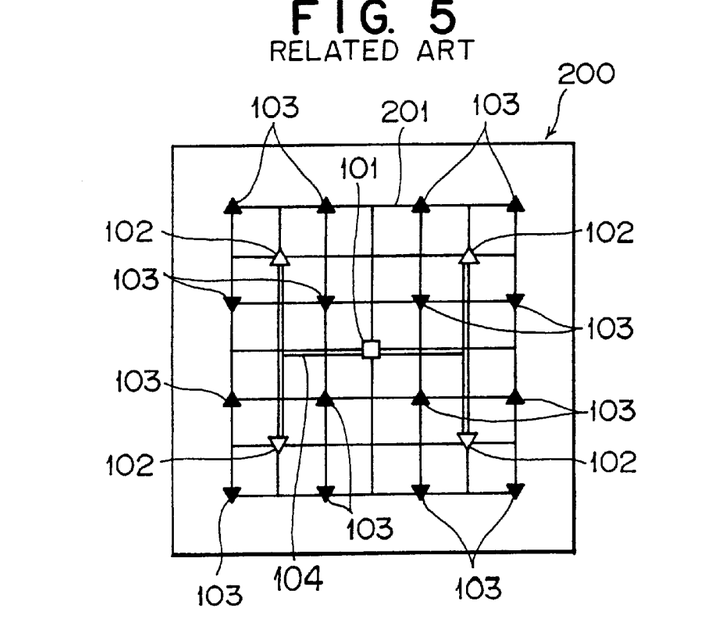
FIG. 5 is a circuit diagram showing a semiconductor integrated circuit(or chip) to which another conventional clock distribution method is applied.

Incidentally, a clock distribution method such as that shown in FIG. 5 has also been proposed. Under the clock distribution method shown in FIG. 5, buffers 101 to 103 are provided in three stages on a square chip 200. The buffers 101 to 103 are connected together by means of an H-shaped clock wiring pattern 104 and a mesh-shaped wiring pattern 201.

More specifically, the first-stage driver 101 for receiving a clock signal from the outside of the chip is disposed at the center of the chip 200, as in the case of the chip shown in FIG. 4. An output from the first-stage driver 101 is input to four second-stage drivers 102 by way of the H-shaped clock wiring pattern 104 centered on the driver 101. Sixteen third-stage drivers 103 are provided in the cell region of the chip 200 at a substantially uniform density, as in the case of the chip shown in FIG. 4.

All the output terminals of the four second-stage drivers 102 and the input terminals of the sixteen third-stage drivers 103 are connected together by way of the mesh-shaped wiring pattern 201.

The H-shaped clock wiring pattern 104 and the mesh-shaped wiring pattern 201 are respectively formed into different wiring layers. In the example shown in FIG. 5, all the four second-stage drivers 102 and the sixteen third-stage drivers 103 are provided at the nodes of the mesh-shaped wiring pattern 201. The drivers 102 and 103 are not necessarily required to be positioned on the nodes of the mesh-shaped wiring pattern 201, and the drivers may be provided at other locations on the mesh-shaped wiring pattern 201.

Under the clock distribution method shown in FIG. 5, the output terminals of the second-stage drivers 102 are connected to the input terminals of the third-stage drivers 103 by way of the meshed-wiring pattern 201. Accordingly, this clock distribution method enables the clock skew appearing in the drivers 103 in the final stage to be made uniform more thoroughly than by the clock distribution method shown in FIG. 4.

By the way, a wiring pattern whose width is equal to or less than 1pm (of the order of sub-microns) must be formed in the chip 100 or 200. In a case where such a narrow wiring pattern is formed from aluminum, the resistance of the wiring pattern becomes considerable high. Further, in a case where a narrow wiring pattern is formed from copper in the same manner as is the aluminum wiring pattern, the resistance R of the wiring pattern will become low. Since there exists a tendency toward a further reduction in the width of a wiring pattern, an increase in the resistance R will pose a serious problem in the future. The capacitance C of the wiring pattern is determined by a gap between the wiring patterns without regard for the material of the wiring pattern. The gap is the same as the width of the wiring pattern, and hence the capacitance C of the wiring pattern will obviously increase in the future.

As mentioned previously, where the mesh-shaped wiring pattern 201 is formed into a narrow width such as that mentioned previously over the entire cell region of the chip, the resistance R of the mesh-shaped wiring pattern 201 is increased. As a result, the waveform of a clock signal is apt to round, which in turn may hinder proper operation of an LSI or the like formed on the chip 200.

To prevent such a problem, it is also conceivable that the resistance R of the wiring pattern can be reduced by simple formation of the mesh-shaped wiring pattern 201 from a material of low resistance R or by a simple increase in width of the mesh-shaped wiring pattern 201 to thereby prevent rounding of the waveform of the clock signal.

Figure 6:
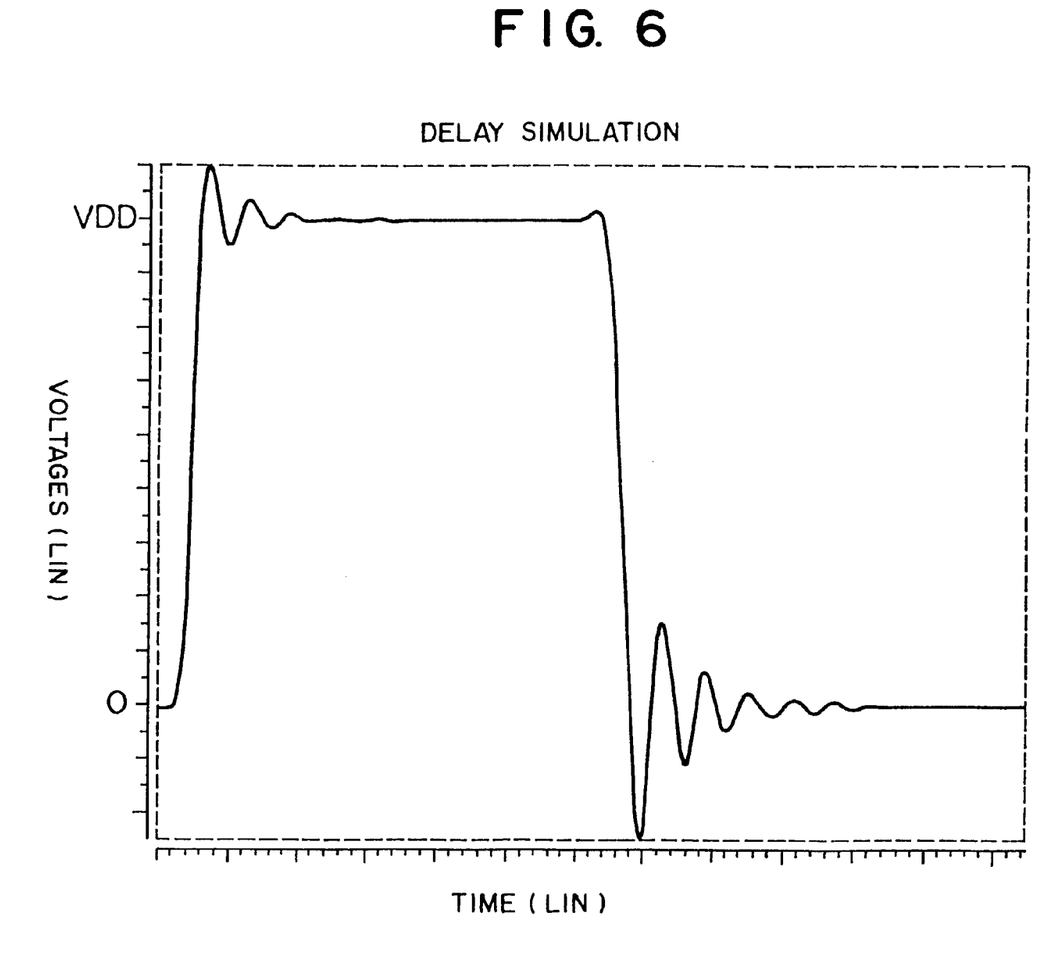
FIG. 6 is a view showing an example of a waveform of a clock signal which has become unstable as a result of reflection of the clock signal with an increase in inductance.

In this case, however, the inductance L becomes high, thereby affecting the clock signal and posing a problem of reflection of the clock signal. For example, as shown in FIG. 6, the waveform of the clock signal itself rises without fail, preventing rounding of the waveform. However, as a result of reflection of the signal stemming from an increase in the inductance L, fluctuations appear in the waveform of the clock signal immediately after the leading edge of the pulse or immediately after the trailing edge or the same. As a result, the clock signal becomes considerably unstable, which in turn may hinder proper operation of an LSI or the like formed on the chic 200.

SUMMARY OF THE INVENTION

The present invention has been conceived in view of the foregoing drawbacks in the art, and an object of the present invention is to provide a clock distribution circuit for use in a semiconductor integrated circuit which can reliably reduce clock skew, while preventing the waveform of the clock signal from rounding, which would otherwise occur due to an increase in resistance, and preventing instability of the clock signal, which would otherwise occur due to an increase in inductance, thereby realizing ideal clock distribution.

To this end, the present invention provides a clock distribution circuit for use in a semiconductor integrated circuit including a plurality of cells formed on a chip, the clock distribution circuit distributing a clock signal to cells having clock terminals, wherein a clock wiring pattern for distributing the clock signal is formed on the chip; and a wiring pattern whose resistance is lower than the clock wiring pattern is formed on a substrate having the chip mounted thereon in such a way as to be connected to the clock wiring pattern at a plurality of locations.

Preferably, the clock wiring pattern may be an H-shaped tree wiring pattern. Further, the clock wiring pattern connected to drivers in the final stage on the chip may be a mesh-shaped wiring pattern which connects together all the drivers in the final stage, and the wiring pattern formed on the substrate may also be a mesh-shaped wiring pattern.

Preferably, the chip may be mounted on the substrate via a plurality of bumps, and the clock wiring pattern connected to the drivers in the final stage on the chip may be connected to the wiring pattern formed on the substrate via the bumps. At this time, the chip may constitute a multichip module and may be mounted on the substrate of the multichip module.

Preferably, the clock wiring pattern formed on the chip is formed from aluminum, and the wiring pattern formed on the substrate is formed from copper.

As mentioned previously, in the clock distribution circuit according to the present invention, the clock wiring pattern formed on the chip is connected to the wiring pattern formed on the substrate (i.e., a wiring pattern whose resistance is lower than that of the clock wiring pattern) at a plurality of locations, and hence the clock signal is distributed and supplied to the drivers also through the wiring pattern formed on the substrate.

Accordingly, even if the clock wiring pattern formed on the chip has high resistance, the wiring pattern of low resistance enables the clock signal to be distributed to the drivers without causing rounding of the waveform of the clock signal, enabling a reduction in clock skew at each of the drivers. At this time, even if there is an increase in the inductance of the wiring pattern formed on the substrate, the resistance of the clock wiring pattern formed on the chip enables prevention of instability of the clock signal, which would otherwise be caused by reflection of the signal.

As mentioned previously, in the clock distribution circuit in the semiconductor integrated circuit according to the present invention, even if the clock wiring pattern formed on the chip has high resistance, the wiring pattern of low resistance formed on the substrate enables the clock signal to be distributed to the drivers without causing rounding of the waveform, enabling a reduction in clock skew at the drivers in the final stages. At this time, even if there is an increase in the inductance of the wiring pattern formed on the substrate, the resistance of the clock wiring patterns formed on the chip enables prevention of instability of the clock signal, which would otherwise be caused by reflection of the signal.

Therefore, it is possible to reliably reduce clock skew, while preventing the waveform of the clock signal from rounding, which would otherwise occur due to an increase in resistance, and preventing instability of the clock signal, which would otherwise occur due to an increase in inductance, thereby realizing ideal clock distribution.

BRIEF DESCRIPTION OF THE DRAWINGS

FIG. 7(*a*) is an equivalent circuit of a mesh-shaped wiring pattern formed on an MCM substrate; and FIG. 7(*b*) is an equivalent circuit of a mesh-shaped wiring pattern formed on a chip.

DESCRIPTION OF THE PREFERRED EMBODIMENTS

Preferred embodiments of the present invention will be described hereinbelow by reference to the accompanying drawings.

[A] Description of a First Embodiment

Figure 1:
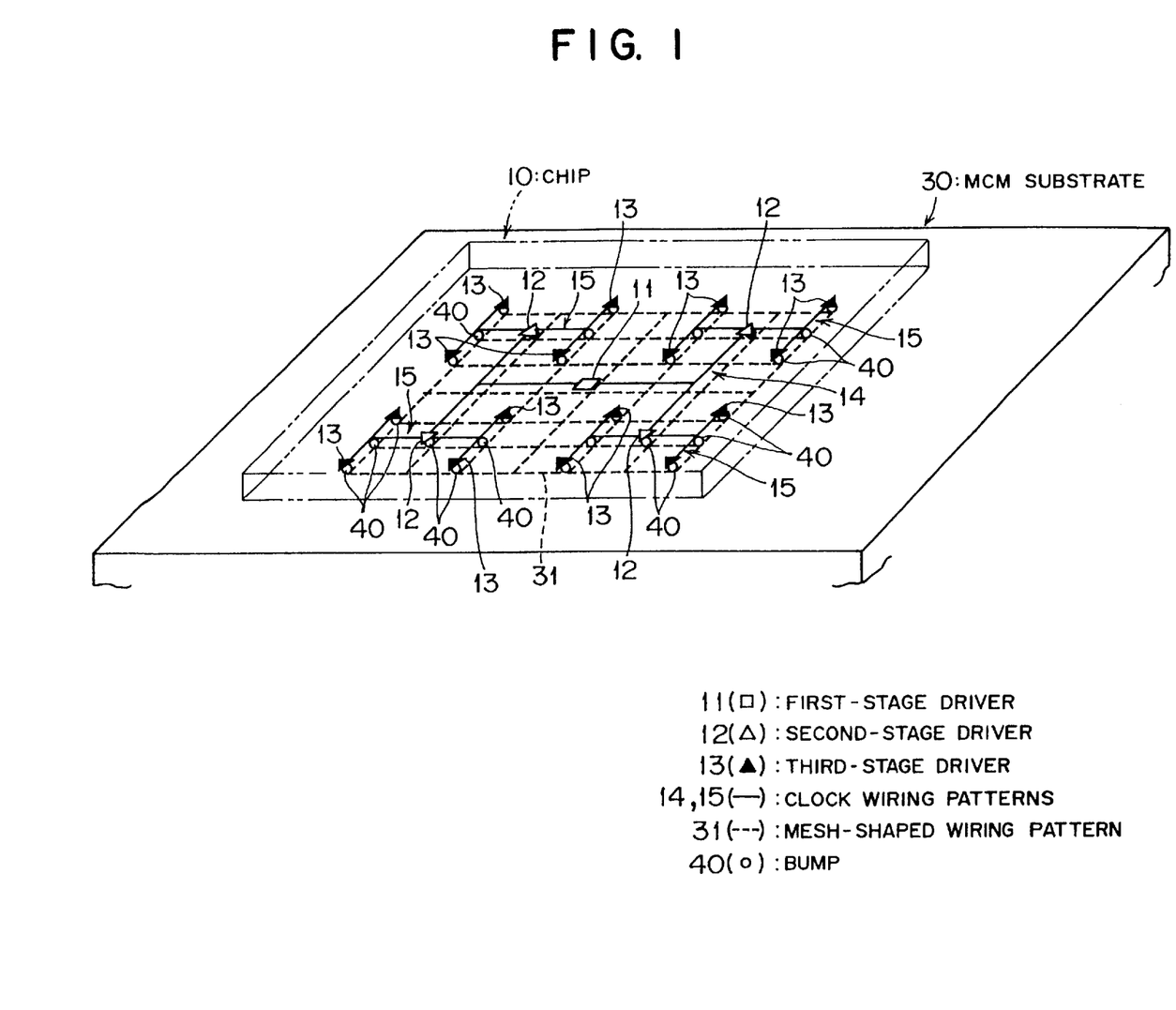
FIG. 1 is a perspective view schematically showing a clock distribution circuit in a semiconductor integrated circuit according to a first embodiment of the present invention.

FIG. 1 is a perspective view schematically showing a clock distribution circuit in a semiconductor integrated circuit according to a first embodiment of the invention. In FIG. 1, a main portion of the clock distribution circuit is illustrated as viewed at an angle from above in a perspective manner.

As shown in FIG. 1, according to the first embodiment, there are provided on a square chip (e.g., a semiconductor integrated circuit) 10 a first-stage driver 11 for receiving a clock signal from the outside of the chip, four second stage drivers 12 for receiving an output from the first stage driver 11; and sixteen third-stage drivers (drivers in the final stage) 13 for receiving outputs from the second-stage drivers 12.

The drivers 11 to 13 are arranged on the chip in the same manner as those arranged under the H-tree clock distribution method shown in FIG. 4.

More specifically, the first-stage driver 11 is disposed on the center of the chip 10, and the first-driver 11 is further connected to the four second-stage drivers 12 by way of an H-shaped clock wiring pattern 14 centered at the first-stage driver 11. With such a configuration, an output from the first-stage driver 11 is delivered to the second-stage drivers 12 by way of the clock wiring pattern 14.

The second-stage drivers 12 are provided respectively at the tip ends of the H-shaped clock wiring pattern 14, and each of the second-stage drivers 12 is further connected to the four third-stage drivers 13 by way of the H-shaped clock wiring pattern 15 centered at the second-stage driver. With such a configuration, an output from the second-stage driver 12 is delivered to the third-stage driver 13 by way of the clock wiring pattern 15.

As mentioned previously, as a result of the drivers 11 to 13 being connected together by way of the H-shaped clock wiring patterns 14 and 15, the clock signal is distributed to the sixteen third-stage drivers 13 provided at a substantially uniform density within the cell disposing region of the chip 10. The thus-distributed clock signal is supplied from each of the third-stage drivers 13 to a clock terminal of a flip-flop or the like. At this time, the wiring patterns from the first-stage driver 11 to the third-stage drivers 13 become substantially equal in length.

The clock wiring patterns 14 and 15 provided on the chip 10 are formed from, e.g., aluminum, to a width of 1 $\mu$m or less. The specifications for the clock wiring patterns 14, 15 are the same as those for wiring patterns which are to be formed on the chip 10 to thereby manufacture a semiconductor integrated circuit such as an LSI. Since the wiring patterns 14, 15 formed on the chip 10 have high resistance, they can be deemed as a distributed R-C transmission line.

Further, according to the first embodiment, a mesh-shaped wiring pattern 31 is formed from, e.g., copper, to a width of about 10 $\mu$m on an MCM substrate 30 on which the chip 10 is mounted. The specifications for the mesh-shaped wiring pattern 31 are the same as those used for forming wiring patterns on the MCM substrate 30. As a matter of course, resistance R2 of the mesh-shaped wiring pattern 31 such as that mentioned previously is considerably lower than resistance R1 of the clock wiring patterns 14, 15 formed from aluminum to a width of 1 $\mu$m or less. Although the gap between the wiring patterns 31 is wide, the width of the wiring pattern 31 is also wide, and hence capacitance C2 of the mesh-shaped wiring patterns 31 provided on the MCM substrate 30 does not produce adversary effect on the clock signal.

Figure 7A:
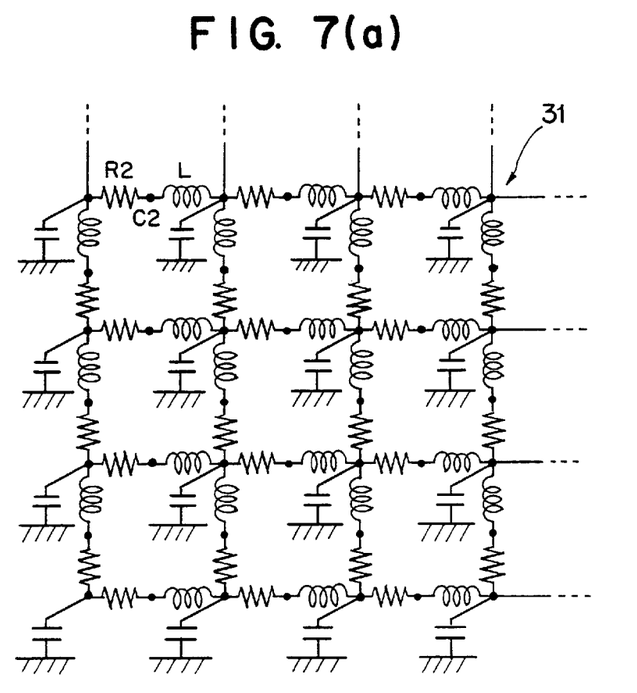

FIG. 7(a) shows a circuit diagram equivalent to the mesh-shaped wiring pattern 31 provided on the MCM substrate 30. As shown in FIG. 7(a), since the mesh-shaped wiring pattern 31 has low resistance R2, the mesh-shaped wiring pattern is handled as a transmission line. Accordingly, the effect of inductance L of the meshed-wiring pattern becomes important.

The mesh-shaped wiring pattern 31 is formed and connected in shunt with the four sets of H-shaped clock wiring patterns 15 which connect the second-stage buffers 12 to the third-stage buffers 13. The mesh-shaped wiring pattern 31 is formed in such a way that nodes of the meshed-wiring pattern correspond to the positions of the second-stage buffers 12 and the third-stage buffers 13 on the H-shaped clock wiring patterns 15 and to the pattern intersection points thereof. The meshed-wiring pattern 31 is formed in one of a plurality or wiring layers (not shown) which constitute the MCM substrate 30.

The chip 10 is mounted on the MCM substrate 30 via a plurality of bumps 40, and the clock wiring patterns 15 provided on the chip 10 are connected in shunt with the mesh-shaped wiring pattern 31 provided on the MCM substrate 30 by way of the bumps 40. The bumps 40 are provided positions where the nodes of the mesh-shaped wiring pattern 31 overlap the positions of the second-stage buffers 12 and the third-stage buffers 13 on the H-shaped clock wiring patterns 15 and the pattern intersection points thereof.

In the clock distribution circuit having the foregoing configuration according to the first embodiment, since the four sets of H-shaped clock wiring patterns 15 provided on the chip 10 are connected in shunt with the mesh-shaped wiring pattern 31 provided on the MCM substrate 30, all the third-stage drivers 13 are connected together by way of the mesh-shaped wiring pattern 31 provided on the MCM substrate 30. The clock signal is also distributed and supplied to each of the third-stage drivers 13 by way of the mesh-shaped wiring pattern 31.

As mentioned previously, according to the first embodiment, the clock wiring patterns 15 provided on the chip 10 are formed from aluminum to a width of 1 $\mu$m or less, whereas the mesh-shaped wiring pattern 31 provided on the MCM substrate 30 is formed from copper to a width of a few micrometers. Accordingly, resistance R2 of the mesh-shaped wiring pattern 31 is considerably lower than resistance R1 of the clock wiring pattern 15.

Even if resistance R1 of the clock wiring patterns 15 provided on the chip 10 is high, the mesh-shaped wiring pattern 31 of low resistance provided on the MCM substrate 30 enables the clock signal to be distributed to all the third-stage drivers 13 without causing rounding of the waveform, reducing clock skew at each of the third-stage drivers 13. At this time, as shown in FIG. 7(a), even if there is an increase in the inductance L of the mesh-shaped wiring pattern 31 provided on the MCM substrate 30, the resistance R1 of the clock wiring patterns 15 provided on the chip 10 prevents instability of the clock signal, which would otherwise be caused by reflection of the clock signal.

Figure 2:
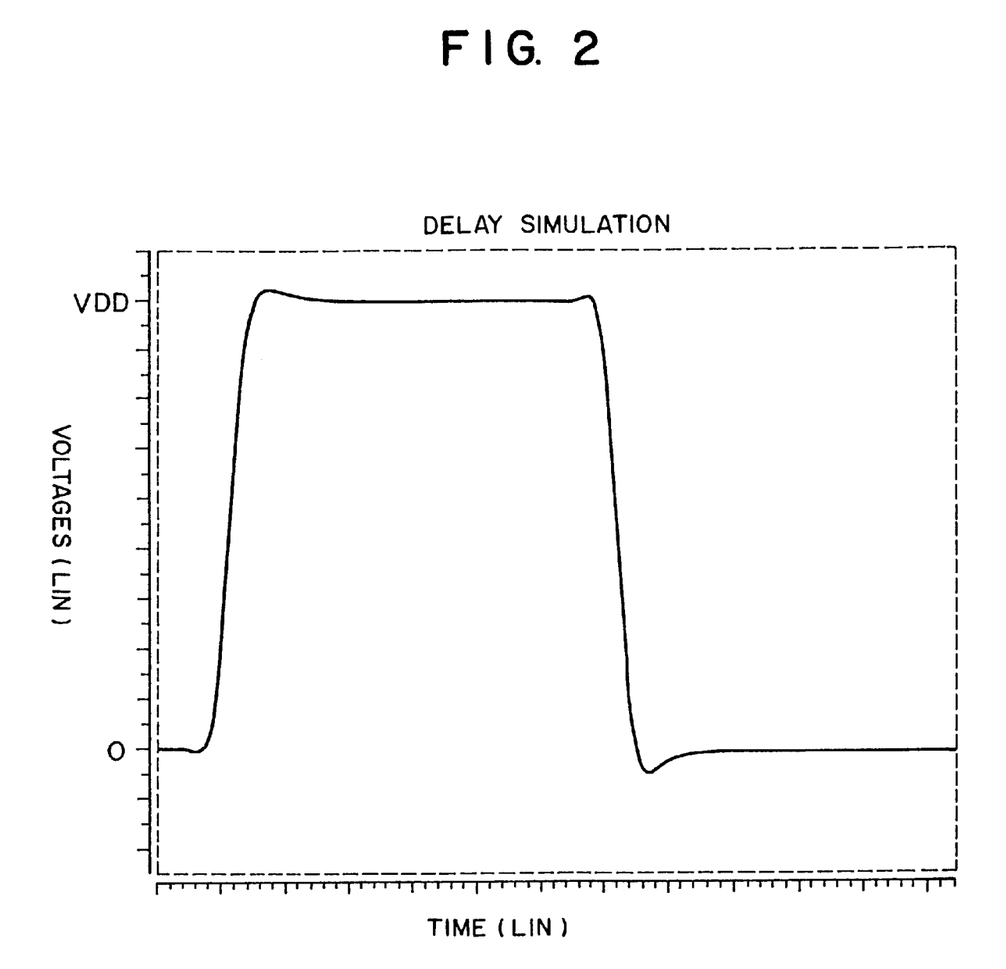
FIG. 2 is a view showing an example waveform of a clock signal stabilized as a result of use of the clock distribution circuit according to embodiments of the present invention.

As mentioned previously, a mere decrease in the resistance or capacitance of the wiring pattern results in an increase in the inductance L of the wiring pattern, which in turn affects the clock signal. As a result, as shown in FIG. 6, fluctuations appear in the waveform of the clock signal immediately after the leading edge of the waveform or immediately after the trailing edge of the waveform, due to reflection of the clock signal associated with an increase in the inductance L, In contrast, in the first embodiment, the clock wiring patterns 15 provided on the chip 10 and the mesh-shaped wiring pattern 31 provided on the MCM substrate 30 operate in such a way as to make a complement to each other. As shown in FIG. 2, the clock signal is eventually stabilized, thereby preventing fluctuations from appearing in the waveform of the signal and consequently preventing hindrance of proper operation of an LSI or the like formed on the chip 10.

As mentioned previously, according to the clock distribution circuit according to the first embodiment, the wiring of low resistance provided on the MCM substrate 30 enables the clock signal to be distributed to all the third-stage drivers 13 without causing rounding of the waveform, enabling a reduction in clock skew at the third-stage drivers 13. At this time, resistance R1 of the clock wiring patterns 15 provided on the chip 10 makes it possible to ensure a reduction in clock skew at the third-stage drivers 13 while preventing instability of the clock signal, which would otherwise be caused by reflection of the clock signal. Accordingly, idealistic distribution of the clock signal can be realized.

The mesh-shaped wiring pattern 31 provided on the MCM substrate 30 is not formed by special means and is usually formed in a considerably easy manner through direct use of the method used for forming a wiring pattern on the MCM substrate 30.

According to the first embodiment, adoption of the H-tree clock distribution method with regard to the chip 10 yields the advantage of enabling effectively utilization of a wiring area within the chip 10.

[B] Description of a Second Embodiment

Figure 3:
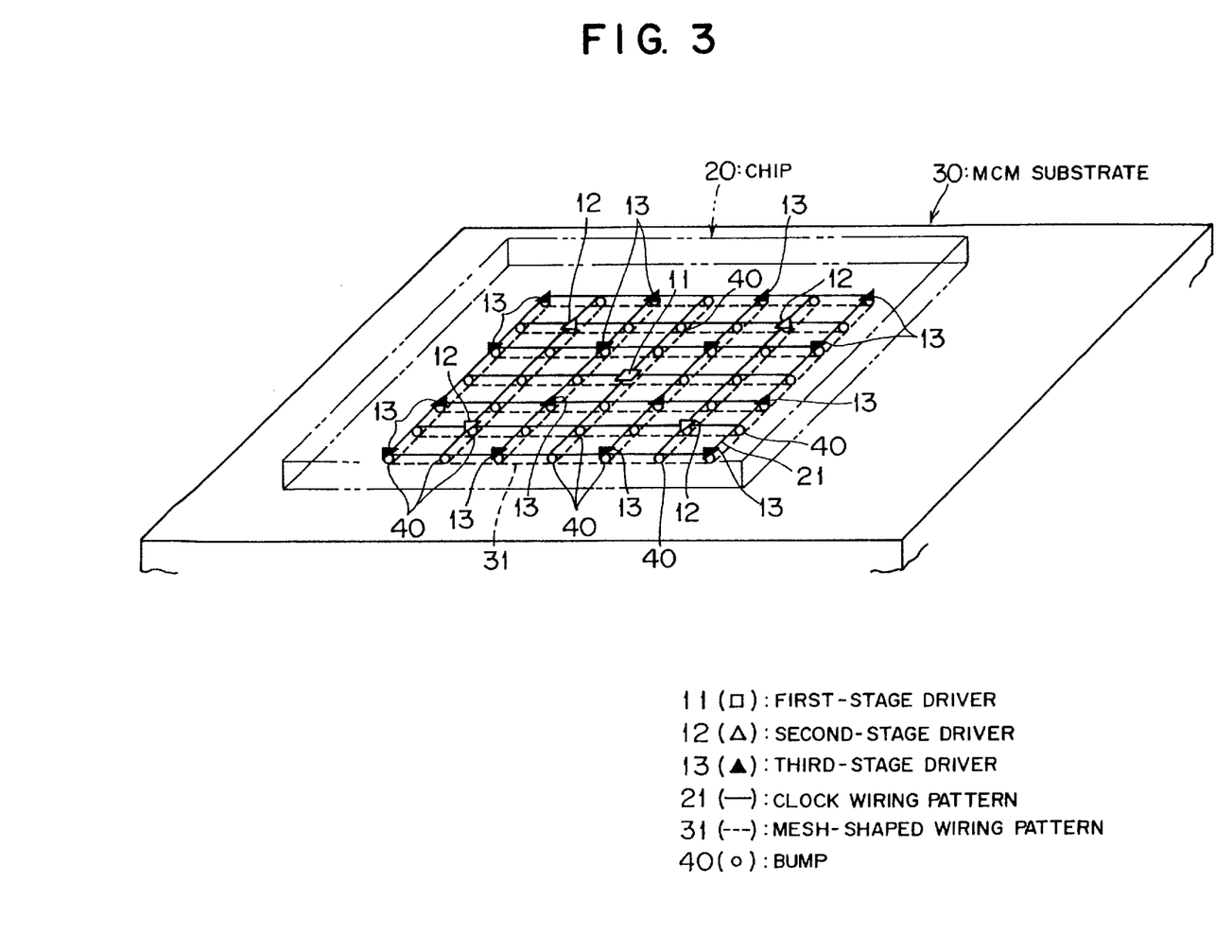
FIG. 3 is a perspective view schematically showing a clock distribution circuit in a semiconductor integrated circuit according to a second embodiment of the present invention.

FIG. 3 is a perspective view schematically showing a clock distribution circuit in a semiconductor integrated circuit according to a second embodiment of the present invention. In FIG. 3 as well, a main portion of the clock distribution circuit is illustrated as viewed at an angle from above in a perspective manner.

As show in FIG. 3, in the second embodiment as well, there are provided on a square chip (e.g., a semiconductor integrated circuit) 20 the first-stage driver 11 for receiving a clock signal from the outside of the chip, the four second-stage drivers 12 for receiving an output from the first-stage driver 11; and the sixteen third-stage drivers (drivers in the final stage) 13 for receiving outputs from the second-stage drivers 12.

In the second embodiment, the drivers 11 to 13 are disposed on the chip in the same manner as those arranged under the clock distribution method shown in FIG. 5.

More specifically, the first-stage driver 11 is disposed on the center of the chip 20, as in the case of the first embodiment. The first-stage driver 11 is further connected to the four second-stage drivers 12 by way of the H-shaped clock wiring pattern 14 centered at the first-stage driver 11. With such a configuration, an output from the first-stage driver 11 is delivered to the second-stage drivers 12 by way of the clock wiring pattern 14. Here, the clock distribution pattern 14 is omitted from FIG. 3.

Figure 7B:
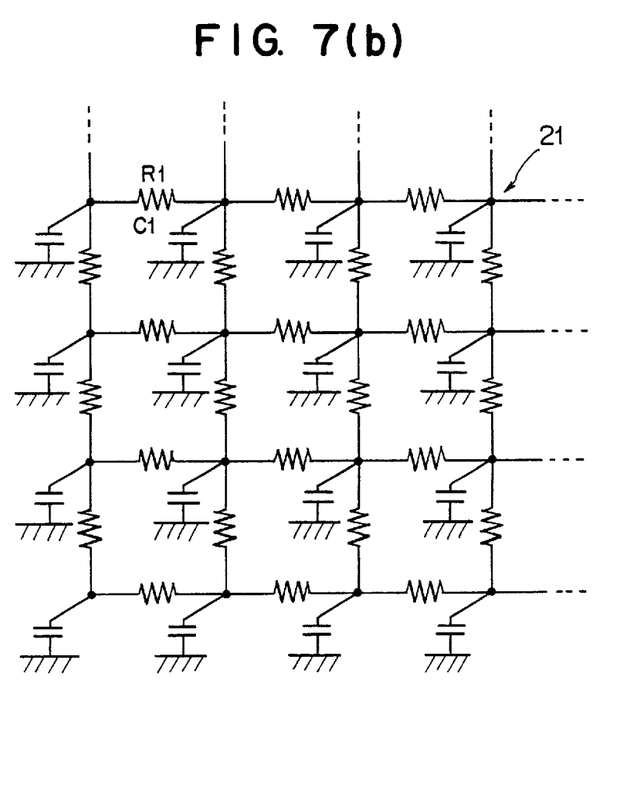

The sixteen third-stage drivers 13 are provided in the cell disposing region of the chip 20 at a substantially uniform density in the same manner as in the first embodiment. All the output terminals of the four second-stage drivers 12 are connected to the input terminals of the sixteen third-stage drivers 13 by way of the mesh-shaped wiring pattern 21. FIG. 7(b) shows a circuit diagram equivalent to the mesh-shaped wiring pattern 21 provided on the chip 20. As shown in FIG. 7(b), since resistance R1 of the mesh-shaped wiring pattern 21 provided on the chip 20 is high, the mesh-shaped wiring pattern can be handled as a distributed R-C transmission line.

The H-shaped clock wiring pattern 14 and the mesh-shaped wiring pattern 21 are formed in different wiring layers, respectively.

In the example shown in FIG. 3, although all the four second-stage drivers 12 and the sixteen third-stage drivers 13 are provided at nodes of the mesh-shaped wiring pattern 21, these drivers 12 and 13 are not necessarily required to be positioned on the nodes of the mesh-shaped wiring pattern 21, so long as they are provided on the mesh-shaped wiring pattern 21.

The clock wiring pattern 14 and the mesh-shaped wiring pattern 21 provided on the chip 20 are formed from, e.g., aluminum, to a width of 1 $\mu$m or less, as in the case of the first embodiment. The specifications for the clock wiring pattern 14 and the mesh-shaped wiring pattern 21 are the same as those used for forming wiring patterns on the chip 20 so as to manufacture a semiconductor integrated circuit such as an LSI.

In the second embodiment as well, the mesh-shaped wiring pattern 31 having the same specifications as those used in the first embodiment is formed on the MCM substrate 30 (one of a plurality of wiring layers which constitute the MCM substrate 30) on which the chip 10 is placed.

The mesh-shaped wiring pattern 31 according to the second embodiment is formed and connected in shunt with the mesh-shaped wiring pattern 21 provided on the chip 20. At this time, the mesh-shaped wiring pattern 31 is formed in such a way that the nodes of the mesh-shaped wiring pattern 31 correspond to those of the mesh-shaped wiring pattern 21 provided on the chip 20.

The chip 20 is mounted on the MCM substrate 30 by way of the plurality of bumps 40, and the mesh-shaped wiring pattern 21 provided on the chip 20 is connected in shunt with the mesh-shaped wiring pattern 31 provided on the MCM substrate 30 by way of the bumps 40. According to the second embodiment, the bumps 40 are placed at positions where the nodes of the mesh-shaped wiring pattern 31 and the nodes of the mesh-shaped wiring pattern 21 overlap one another.

As mentioned previously, in the clock distribution circuit having the foregoing configuration according to the second embodiment, the mesh-shaped wiring pattern 21 provided on the chip 20 is connected in shunt with the mesh-shaped wiring pattern 31 provided on the MCM substrate 30. Accordingly, all the third-stage drivers 13 are connected together through the two mesh-shaped wiring patterns 21 and 31, and the clock signal is distributed and supplied to each of the third-stage drivers 13 by way of the mesh-shaped wiring patterns 21 and 31 through parallel transmission.

In the second embodiment as well, resistance R2 of the mesh-shaped wiring pattern 31 of the MCM substrate 30 is considerably lower than resistance R1 of the mesh-shaped wiring pattern 21 provided on the chip 20.

Accordingly, even if resistance R1 of the mesh-shaped wiring pattern 21 provided on the chip 20 is high, the mesh-shaped wiring pattern 31 of low resistance provided on the MCM substrate 30 enables the clock signal to be distributed to all the third-stage drivers 13 without causing rounding of the waveform of the clock signal, enabling a reduction in clock skew at the third-stage drivers 13. As shown in FIG. 7(a), even if there is an increase in the inductance L of the mesh-shaped wiring pattern 31 provided on the MCM substrate 30, resistance R1 of the mesh-shaped wiring pattern 21 provided on the chip 20 prevents instability of the clock signal, which would otherwise be caused by reflection of the clock signal.

That is, in the second embodiment as well, the mesh-shaped wiring pattern 21 provided on the chip 20 and the mesh-shaped wiring pattern 31 provided on the MCM substrate 30 operate so as to make a complement to each other. Accordingly, as shown in FIG. 2, the clock signal is stabilized, which in turn prevents fluctuations from appearing in the waveform, so that proper operation of an LSI or the like formed on the chip 20 is not hindered.

As mentioned previously, the clock distribution circuit according to the second embodiment achieves an action and effects which are the same as those of the first embodiment.

All the third-stage drivers 13 are also connected together even by means of the mesh-shaped wiring pattern 21 of the chip 20. As a result, in comparison with the first embodiment, clock skew at the third-stage drivers 13 can be reduced more reliably.

[C] Others

The present invention is not limited to the foregoing embodiments, and may be practiced in various modified ways without departing from the scope of the present invention.

For example, in the foregoing embodiments, a description has been given of the case where the present invention is applied to the chip mounted on the MCM substrate. However, the present invention is not limited thereto. The present invention may be applied to an LSI chip mounted on an ordinary substrate. In this case as well, there can be achieved an action and effects which are the same as those achieved in the above-described embodiments.

Also, in the foregoing embodiments, a description has been given of the case where the number of stages in which the drivers are provided is three; that is, where there are one first-stage driver, four second-stage drivers, and sixteen third-stage drivers. However, the present invention is not limited to these numerals.

Further, in the above-described embodiments, a description has been given of the case where the wiring patterns on the chip are formed from aluminum and the wiring patterns on the substrate are formed from copper. However, the present invention is not limited to these materials. Even in the case where the wiring patterns are formed from the same material, the same action and effects as those of the above-described embodiment can be achieved, if the width of the wiring patterns formed on the chip is made different from the width of the wiring patterns formed on the substrate (e.g., the wiring patterns formed on the substrate are made wider than the wiring patterns formed on the chip).

Still further, in the above-described embodiments, a description has been given of the case where the wiring pattern formed on the chip has an H-tree or mesh shape and the wiring patterns formed on the substrate have a mesh shape. However, the present invention is not limited to these shapes of wiring patterns. The wiring patterns may be formed into other shapes.

Furthermore, although the bumps for connecting the wiring patterns provided on the chip with the wiring patterns provided on the substrate are placed on nodes of the mesh-shaped wiring pattern provided on the substrate in the above-described embodiments, the present invention is not limited to such locations. The bumps may be placed on other locations.

What is claimed is:

1. A clock distribution circuit, to be used in a semiconductor integrated circuit having a plurality of interconnected cells arranged on a chip mounted on a substrate, for remotely distributing an externally applied clock signal to each of a plurality of clocked-circuit cells, each of which has a clock input terminal, so as to synchronize operations of the plural clocked-circuit cells, said clock distribution circuit comprising:

an initial-stage driver disposed in the chip and connected to said externally applied clock signal;

said initial-stage driver having a clock output terminal for sending said externally applied clock signal;

a plurality of final-stage drivers disposed in the chip and each connected to at least one of the plural clocked-circuit cells, each said final-stage driver having a clock input terminal for receiving a clock signal from said initial stage driver to be provided to the corresponding clocked-circuit cell;

a first clock wiring pattern, disposed in the chip and interconnecting between the clock output terminal of said initial-stage driver and the clock input terminals of said final-stage drivers, for distributing said clock signal from said initial-stage driver to the individual final-stage driver;

a second clock wiring pattern disposed on the substrate and having a lower resistance than said first clock wiring pattern; and means for interconnecting between said first clock wiring pattern and said second clock wiring pattern at a plurality of points between said initial-stage driver and each of said plural final-stage drivers such that said first clock wiring pattern and said second clock wiring pattern extend in parallel.

2. The clock distribution circuit according to claim 1, wherein said first clock wiring pattern is an H-shaped tree wiring pattern.

3. The clock distribution circuit according to claim 1, wherein said first clock wiring pattern includes a mesh-shaped wiring pattern which interconnects between all said plural final-stare drivers.

4. The clock distribution circuit according to claim 1, wherein said second clock wiring pattern is a mesh-shaped wiring pattern.

5. The clock distribution circuit according to claim 1, wherein said interconnecting means is a multiplicity of bumps, and the chip is mounted on the substrate via said multiple bumps.

6. The clock distribution circuit according to claim 2, wherein said interconnecting means is a multiplicity of bumps, and the chip is mounted on the substrate via said multiple bumps.

7. The clock distribution circuit according to claim 3, wherein said interconnecting means is a multiplicity of bumps, and the chip is mounted on the substrate via said multiple bumps.

8. The clock distribution circuit according to claim 4, wherein said interconnecting means is a multiplicity of bumps, and the chip is mounted on the substrate via said multiple bumps.

9. The clock distribution circuit according to claim 5, wherein the chip is a component of a multi-chip module and is mounted on the substrate for the multi-chip module.

10. The clock distribution circuit according to claim 6, wherein the chip is a component of a multi-chip module and is mounted on the substrate for the multi-chip module.

11. The clock distribution circuit according to claim 7, wherein the chip is a component of a multi-chip module and is mounted on the substrate for the multi-chip module.

12. The clock distribution circuit according to claim 8, wherein the chip is a component of a multi-chip module and is mounted on the substrate for the multi-chip module.

13. The clock distribution circuit according to claim 1, wherein said first clock wiring pattern is made of aluminum, and said second clock wiring pattern is made of copper.

14. The clock distribution circuit according to claim 2, wherein said first clock wiring pattern is made of aluminum, and said second clock wiring pattern is made of copper.

15. The clock distribution circuit according to claim 3, wherein said first clock wiring pattern is made of aluminum, and said second clock wiring pattern is made of copper.

16. The clock distribution circuit according to claim 4, wherein said first clock wiring pattern is made of aluminum, and said second clock wiring pattern is made of copper.

17. The clock distribution circuit according to claim 5, wherein said first clock wiring pattern is made of aluminum, and said second clock wiring pattern is made of copper.

18. The clock distribution circuit according to claim 6, wherein said first clock wiring pattern is made of aluminum, and said second clock wiring pattern is made of copper.

19. The clock distribution circuit according to claim 7, wherein said first clock wiring pattern is made of aluminum, and said second clock wiring pattern is made of copper.

20. The clock distribution circuit according to claim 8, wherein said first clock wiring pattern is made of aluminum, and said second clock wiring pattern is made of copper.

21. The clock distribution circuit according to claim 9, wherein said first clock wiring pattern is made of aluminum, and said second clock wiring pattern is made of copper.

22. The clock distribution circuit according to claim 10, wherein said first clock wiring pattern is made of aluminum, and said second clock wiring pattern is made of copper.

23. The clock distribution circuit according to claim 11, wherein said first clock wiring pattern is made of aluminum, and said second clock wiring pattern is made of copper.

24. The clock distribution circuit according to claim 12, wherein said first clock wiring pattern is made of aluminum, and said second clock wiring pattern is made of copper.

\* \* \* \* \*